(12) United States Patent  
Esquivel

(10) Patent No.: US 6,201,277 B1  
(45) Date of Patent: Mar. 13, 2001

(54) SLOT TRENCH ISOLATION FOR FLASH EPROM

(75) Inventor: Agerico L. Esquivel, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/484,196

(22) Filed: Jun. 7, 1995

Related U.S. Application Data

(63) Continuation of application No. 08/280,753, filed on Jul. 26, 1994, now abandoned, which is a continuation of application No. 08/114,811, filed on Aug. 31, 1993, now abandoned.

(51) Int. Cl.[7] .......................... H01L 29/788; H01L 29/76; H01L 29/94; H01L 31/062
(52) U.S. Cl. ........................ 257/316; 257/390; 257/397; 257/398
(58) Field of Search ..................... 257/314, 315, 257/316, 390, 397, 398

(56) References Cited

U.S. PATENT DOCUMENTS

| | | | |
|---|---|---|---|
| 5,045,489 | * 9/1991 | Gill et al. ........................... | 257/324 |
| 5,071,782 | * 12/1991 | Mori .................................... | 257/315 |
| 5,146,426 | * 9/1992 | Mukherjee et al. ............... | 257/316 |
| 5,159,431 | * 10/1992 | Yoshikawa ......................... | 257/316 |

FOREIGN PATENT DOCUMENTS

| | | | |
|---|---|---|---|
| 61-184883 | * 8/1986 | (JP) ................................... | 257/316 |
| 62-43180 | * 2/1987 | (JP) ................................... | 257/316 |
| 62-84550 | * 4/1987 | (JP) ................................... | 257/316 |
| 4-26162 | * 1/1992 | (JP) ................................... | 257/316 |
| 4-75390 | * 3/1992 | (JP) ................................... | 257/314 |
| 4-280673 | * 10/1992 | (JP) ................................... | 257/316 |

* cited by examiner

*Primary Examiner*—Ngân V. Ngô  
(74) *Attorney, Agent, or Firm*—Carlton H. Hoel; W. James Brady; Frederick J. Telecky, Jr.

(57) ABSTRACT

A programmable memory device having slot trenches (14). A plurality of floating gates (22) are separated from a surface of semiconductor body (10) by a gate dielectric (24). A plurality of slot trenches (14) isolate memory cells (12) from each other. Each of the slot trenches (14) extends below the surface of the semiconductor body (10) between adjacent floating gates (22). A control gate (20) extends over the floating gates (22) and a portion of each of the slot trenches (14).

10 Claims, 8 Drawing Sheets

US 6,201,277 B1

SLOT TRENCH ISOLATION FOR FLASH EPROM

This application is a continuation of U.S. application Ser. No. 08/280,753, filed Jul. 26, 1994, now abandoned, which is a continuation of U.S. application Ser. No. 08/114,811, filed Aug. 31, 1993, now abandoned.

FIELD OF THE INVENTION

This invention generally relates to non-volatile memories, and more specifically to electrically programmable read-only memories.

BACKGROUND OF THE INVENTION

An electrically programmable read-only memory (EPROM) can be electrically programmed to permanently store data. EPROMs rely on a charge tunneling phenomenon to permanently store a charge in an electrical conductor of each cell. Avalanche and Fowler-Nordheim effects are examples of the tunneling phenomenon. Essentially, an EPROM is programmed by applying certain voltages thereto, sufficient to draw electron charges through a thin insulator and become trapped in a conductive material, such as polycrystalline silicon or silicon nitride. The voltages applied to the cell for reading the contents thereof are insufficient to release the trapped charges, and thus, once electrically programmed, the cell retains the information for a long period of time.

In semiconductor memory technology, there is a constant effort to construct devices with higher circuit densities to accommodate more cells per unit of wafer area. As technology increases and device areas become smaller, the area required to isolate cells from each other makes up a larger percentage of the total area required by an EPROM. Thus, there is a need to reduce the area required to isolate EPROM cells from each other.

SUMMARY OF THE INVENTION

A programmable memory device having a plurality of memory cell rows is disclosed. Each memory cell row comprises a plurality of floating gates separated from a surface of semiconductor body by a gate dielectric and a plurality of slot trenches for isolating memory cells of the memory cell row from each other. Each of the slot trenches extends below the surface of the semiconductor body between adjacent floating gates. Each memory cell row also comprises a control gate extending over the floating gates and a portion of each of the slot trenches.

An advantage of the invention is providing a programmable memory that allows a higher packing density.

A further advantage of the invention is providing an isolation scheme for a programmable memory that avoids the prior art problems associated with moat encroachment.

A further advantage of the invention is providing an isolation scheme for a programmable memory that avoids Kooi effects (undesired silicon nitride growth).

A further advantage of the invention is providing an isolation scheme for a programmable memory that produces reproducible line widths.

These and other advantages will be apparent to those of ordinary skill in the art having reference to the specification in conjunction with the drawings and claims.

BRIEF DESCRIPTION OF THE DRAWINGS

In the drawings:

FIGS. 2b–c are cross-sectional views of the EPROM of FIG. 2a;

Corresponding numerals and symbols in the different figures refer to corresponding parts unless otherwise indicated.

DETAILED DESCRIPTION OF PREFERRED EMBODIMENTS

The preferred embodiments of the invention will be described in conjunction with an EPROM device. However, it will be apparent to those skilled in the art that the advantages of the invention are also applicable to other integrated circuits, such as electrically erasable programmable read-only memories (EEPROMs).

Figure 1:
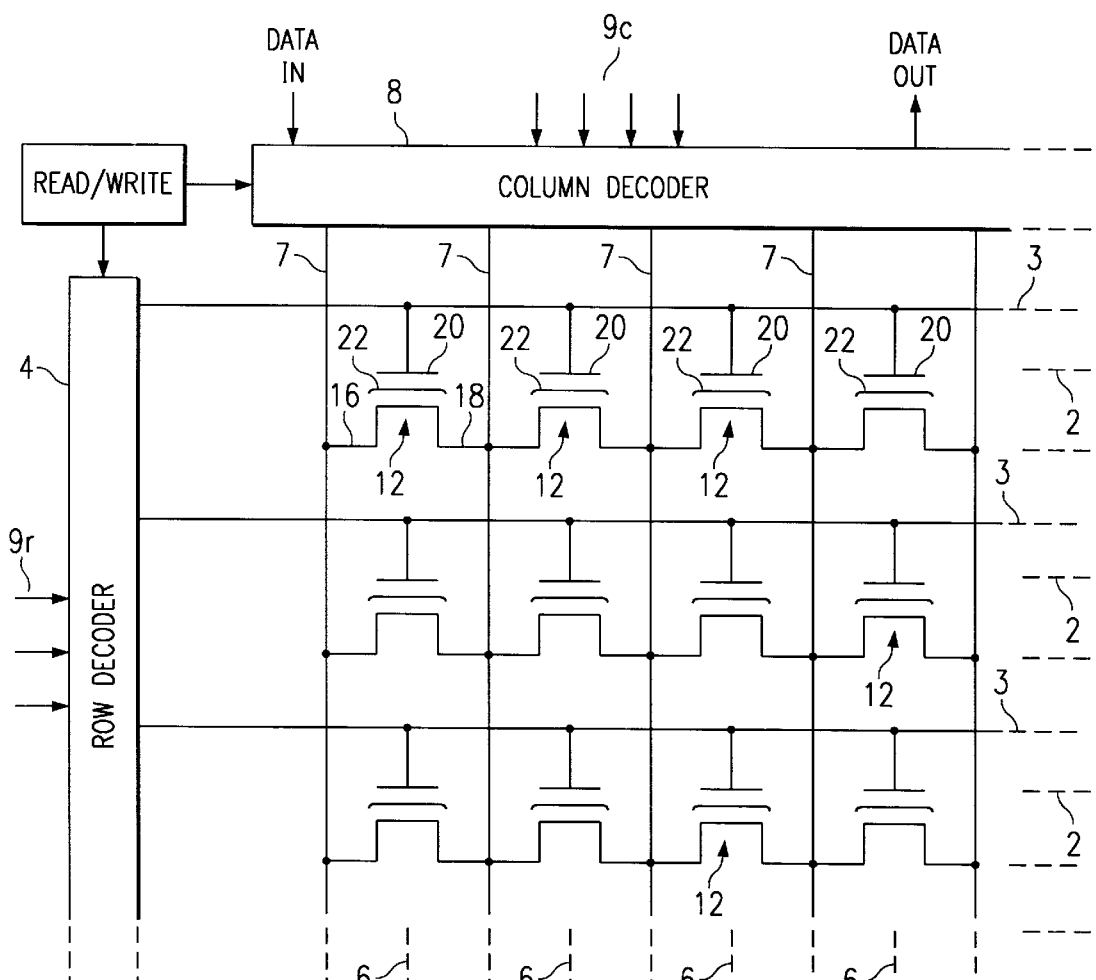
FIG. 1 is a schematic diagram of a portion of an EPROM device constructed according to the invention.

Referring to FIG. 1, there is illustrated, in schematic form, a partial view of an array of floating gate memory cells 12. Each cell 12 comprises a field effect transistor having a source 16, a drain 18, a floating gate 22 and a control gate 20. Each of the control gates 20 in a row 2 of cells is connected to a row address line 3 and each of the row address lines 3 is connected to a row decoder 4. Each source or drain electrode 16 or 18 in a column 6 of cells is connected to a column line 7 and the source and drain column lines 7 are connected to a column decoder 8.

In a write or program mode, the column decoder 8 functions to apply either a relatively high voltage (e.g. 10–12 volts) or a low voltage (e.g., 0 volts) selectively to each source and drain column line 7 in response to a column address on lines 9c and a binary data input. Also during a write or program operation, the row decoder 4 applies either a high voltage or a low voltage to each of the row lines 3 in response to a row address on lines 9R. In the read mode, the column detector 8 grounds the column line to the right of a selected cell and connects a static load to the column line to the left of the selected cell. The row decoder 4 applies a logic "1" voltage to the selected row line and a logic "0" voltage to all other row lines.

Figure 2A:
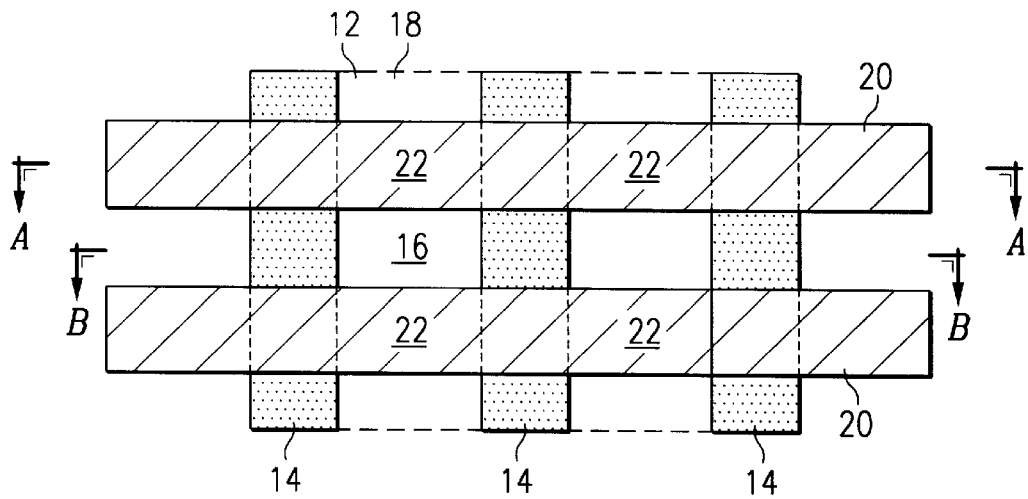
FIG. 2a is a top view of a portion of an EPROM according to the first preferred embodiment of the invention.

A top view of a first preferred embodiment of the invention is shown in FIG. 2a. The EPROM of FIG. 2a contains a large number of memory cells 12 commonly referred to as "H-cells" because of their configuration. Slot trenches 14 separate columns of memory cells 12 instead of the traditional LOCOS isolation. Each memory cell 12 consists of a source region 16, a drain region 18, a control gate 20, and a floating gate 22. It should of course be noted that source and drain regions 16 and 18 may be reversed in that region 16 may comprise the drain and region 18 comprise the source.

Figure 2B:
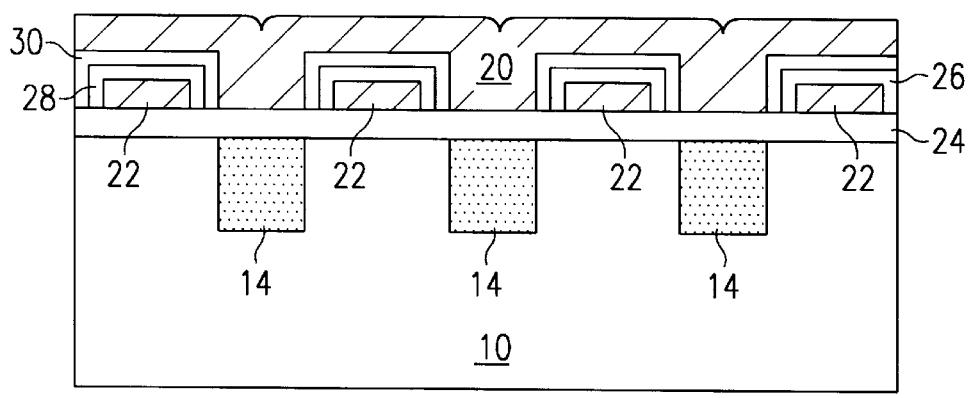
Figure 2C:
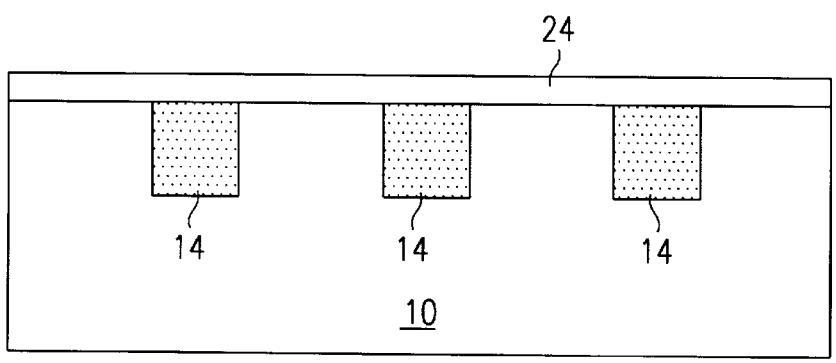

FIGS. 2b and 2c show cross-sectional views of the EPROM of FIG. 2a at lines A–A' and B–B', respectively. Slot trenches 14 are located within semiconductor body 10. A gate insulator 24 covers the surface of semiconductor body 10. Gate insulator 24 may, for example comprise a thermal or deposited gate oxide. Floating gates 22 typically comprise a first layer of polysilicon. An interlevel insulating layer 26 separates floating gates 22 from control gate 20. Interlevel insulating layer 26 may, for example, comprise a layer of interlevel oxide 28 and an layer of interlevel nitride 30. It will be apparent to those skilled in the art that other dielectrics may alternatively be used.

Figure 3:
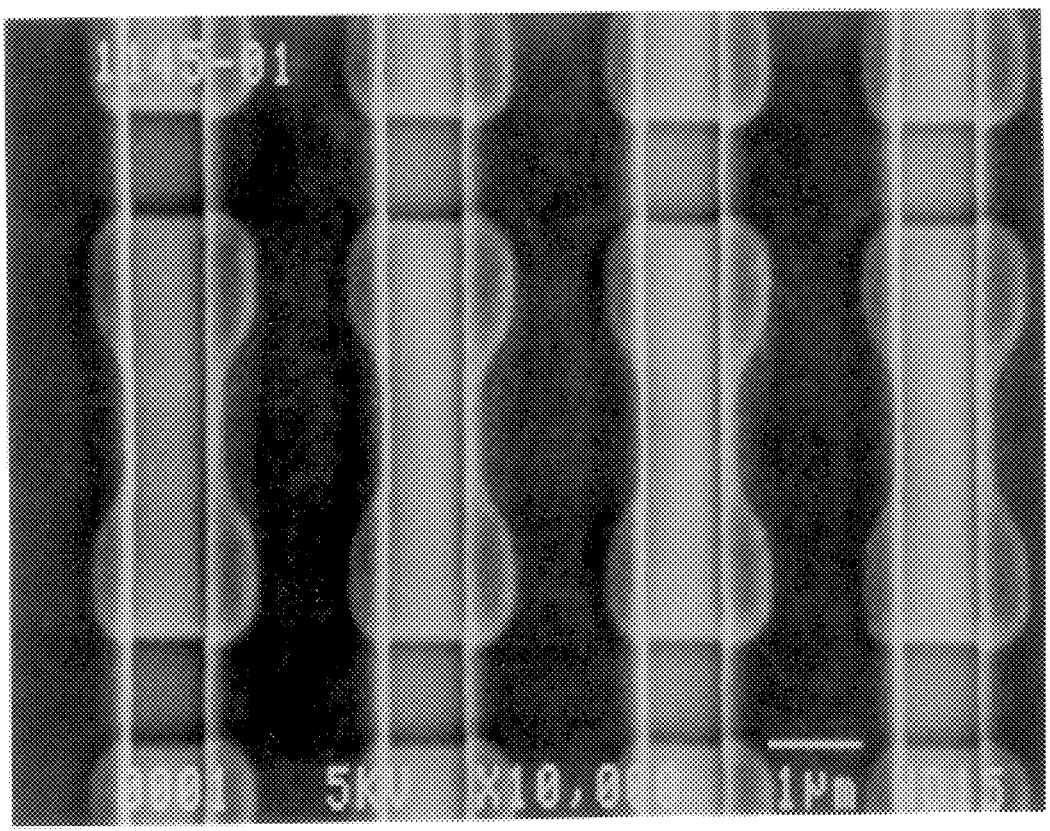
FIG. 3 is a top view of a device having both the slot trench isolation according to the preferred embodiments and traditional isolation.

FIG. 3 is a top view of an EPROM device having both the traditional LOCOS isolation and the slot trench isolation of the preferred embodiment. The slot trench of the preferred embodiments has several advantages over LOCOS isolation. First, the slot trench approach requires less area. A slot trench can have the desired depth for isolation with a narrower width than a LOCOS isolation. Thus, a higher packing density can be achieved. Second, there is no moat encroachment associated with the slot trench approach. LOCOS isolation requires the formation of a thick field oxide. The edges of a thick field form a "bird's beak" as the thickness of the oxide tapers off. This "bird's beak" extends over a varying portion of the moat region and is known as moat encroachment. This problem does not occur with a slot trench. Third, the steam high temperature oxidation used in the LOCOS process creates silicon nitride near the edges of the "bird's beak". This problem is also avoided in the slot trench approach because the high temperature oxidation is not required. Finally, slot trench isolation provides reproducible linewidths which are easier to measure than the irregular shapes of the edges of the LOCOS isolation.

Figure 4A:
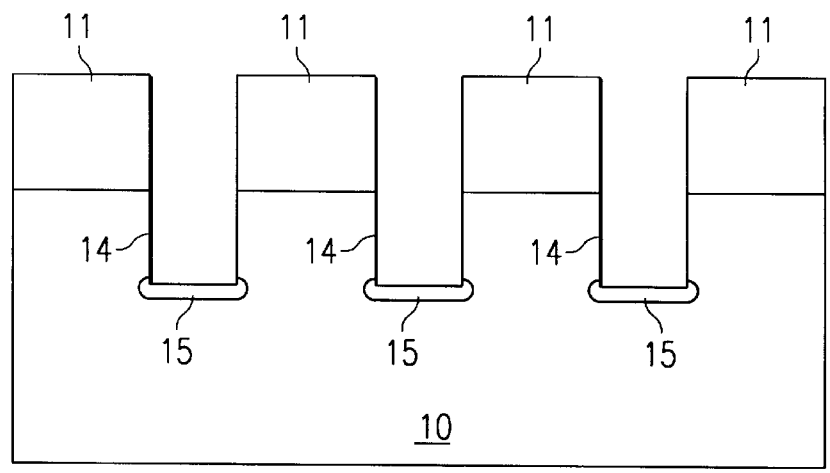
FIGS. 4a–4e are cross-sectional views of the EPROM of FIG. 2a at various stages of fabrication.
Figure 4B:
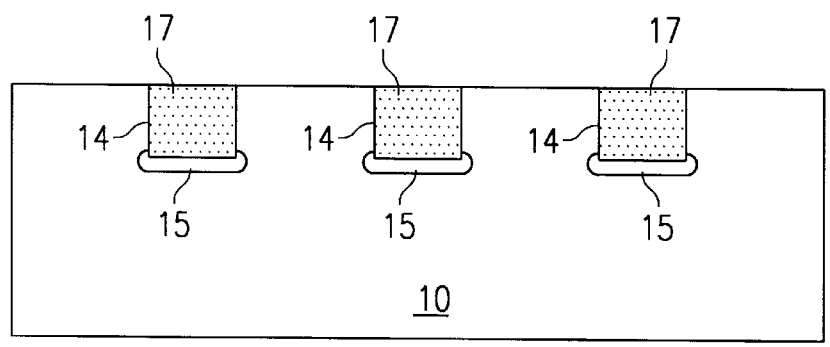

The formation of the EPROM of FIG. 2a will now be described with reference to FIGS. 4a through 4e. Referring to FIG. 4a, slot trenches 14 are patterned with masking layer 11, preferably using the same mask that will later be used to pattern the first polysilicon (floating gate) layer. Next, slot trench 14 is etched by conventional techniques to a depth on the order of 0.5 microns. It will be apparent to those skilled in the art that the depth of the trench will vary depending on device criteria and may exceed 1.0 micron. Then, channel stop 15 may be formed in the bottom of slot trench 14 by conventional implantation techniques or rapid thermal processing. Masking layer 11, which may, for example, comprise photoresist, is then removed. Next, a dielectric layer 17 is deposited over the surface of the structure and etched so that it just fills the trench as shown in FIG. 4b. In the preferred embodiment, dielectric layer 17 comprises tetra-ethoxysilane (TEOS) deposited by plasma enhanced chemical vapor deposition (PECVD). However, it will be apparent to those skilled in the art that other dielectrics, such as dichlorsilane or nitrous oxide, may alternatively be used. The device is then annealed by, for example, a furnace anneal or rapid thermal processing.

Figure 4C:
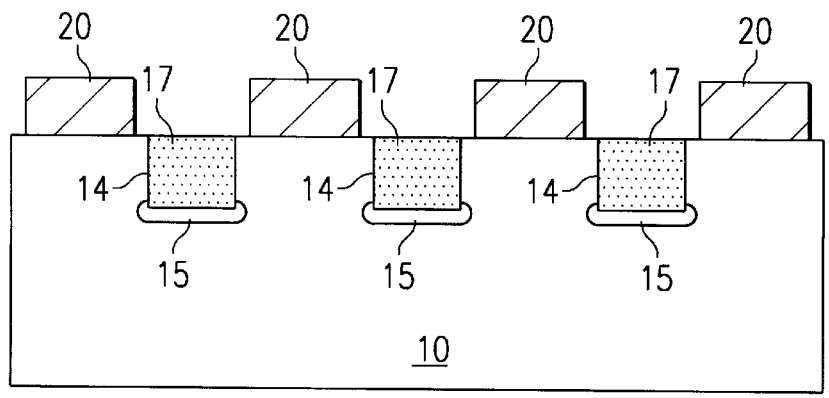
Figure 4D:
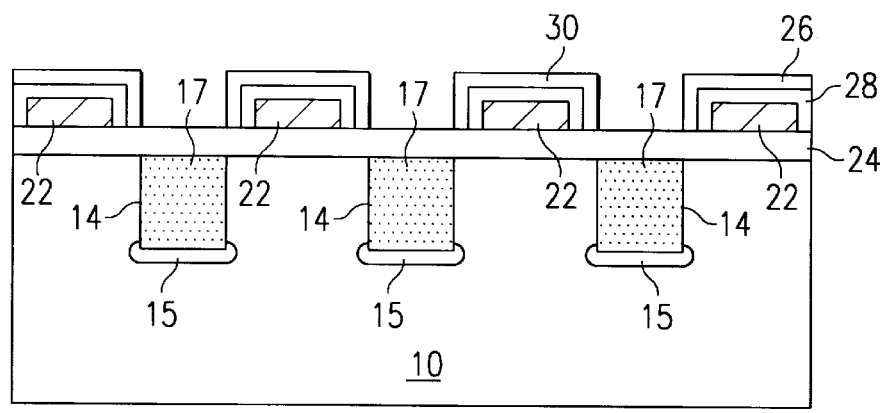

Referring to FIG. 4c, gate insulator 24 may be formed by thermal oxidation. Alternatively, a high quality low-pressure chemical-vapor-deposition (LPCVD) oxide with $N_2O$ may be deposited. Next, a first layer of conductive material, such as polysilicon, is deposited over the surface and etched to form floating gates 22. Referring to FIG. 4d, interlevel dielectric layer 26 is formed over the surface of the structure. In the preferred embodiment, interlevel dielectric layer 26 comprises a layer of oxide 28 formed by LPCVD and a layer of nitride 30 also formed by LPCVD. It will be apparent to those skilled in the art that nitride layer 30 is optional and need not be formed and that oxide layer 28 may be formed by alternative methods well known in the art.

Figure 4E:
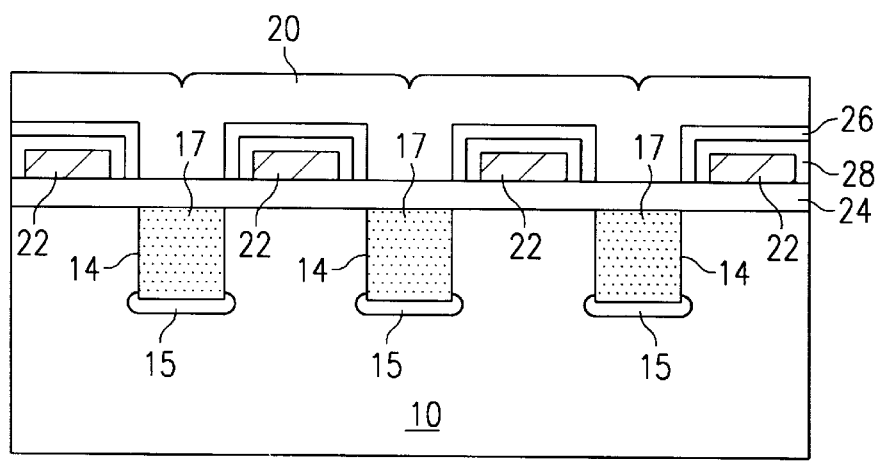

A second layer of conductive material, such as polysilicon, is then deposited over the surface of the structure, as shown in FIG. 4e. The second polysilicon layer, interlevel dielectric layer 26 and floating gate 22 are etched to form floating gates 22 and control gates 20.

After the formation of the structure of FIG. 4e, processing may continue with conventional techniques for forming source and drain regions 16 and 18, as well as interconnect lines (not shown) and other transistors and devices. Methods for forming such elements are well known in the art. Individual circuits may then be separated from portions of semiconductor body 10 and external connections made thereto by way of wire bonding, direct bump bonding, or the like, as is well known in the art. The individual circuits may then be packaged into a dual-in-line package, a chip carrier, or another type of package. An example of such a package is described in U.S. Pat. No. 4,495,376 issued Jan. 22, 1985 and assigned to Texas Instruments, Inc.

Figure 5:
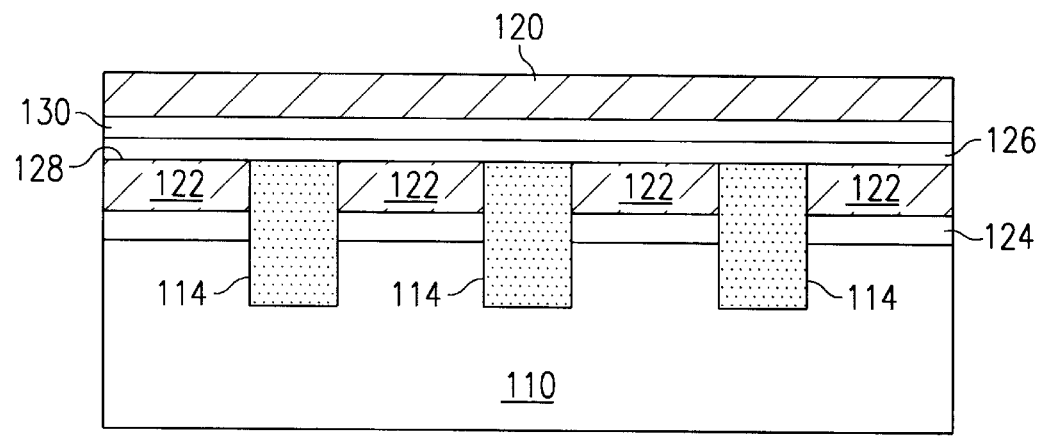
FIG. 5 is a cross-sectional view of an EPROM according to a second preferred embodiment of the invention.

A second preferred embodiment of the invention is shown in FIG. 5. A top view of the second preferred embodiment is identical to the first preferred embodiment as shown in FIG. 2a. A gate insulator 124 covers the surface of semiconductor body 110. Gate insulator 124 may, for example comprise a thermal or deposited gate oxide. Floating gates 122 typically comprise a first layer of polysilicon. Slot trenches 114 extend between floating gates 122 and into semiconductor body 110. An interlevel insulating layer 126 separates floating gates 122 from control gate 120. Interlevel insulating layer 126 may, for example, comprise a layer of interlevel oxide 128 and an layer of interlevel nitride 130. It will be apparent to those skilled in the art that other dielectrics may alternatively be used.

Figure 6A:
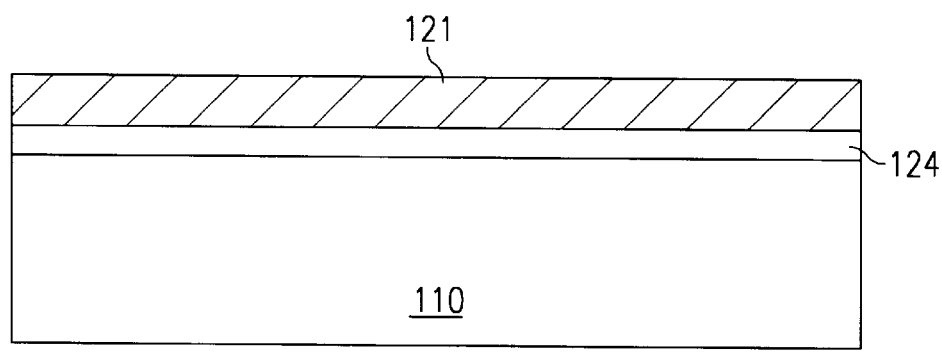
Figure 6B:
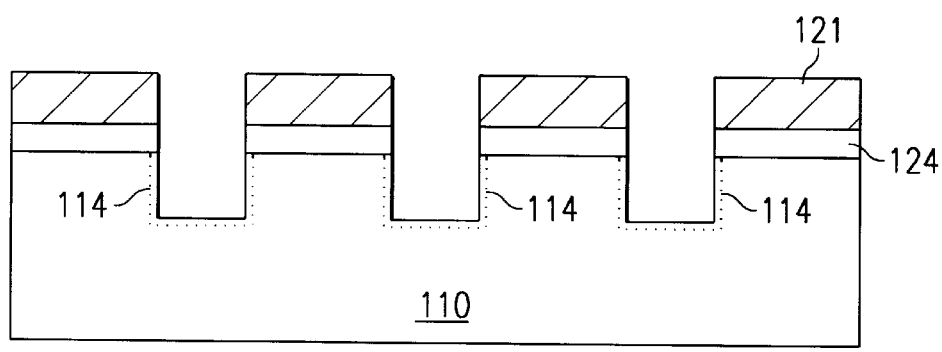

The formation of the structure of FIG. 5 will now be described with reference to FIGS. 6a–6e. Referring to FIG. 6a, gate insulator 124 is formed over the surface of semiconductor body 110 by, for example, thermal oxidation. Alternatively, a high quality LPCVD oxide with $N_2O$ may be deposited. Next, a first layer of conductive material, such as polysilicon layer 121, is deposited over the surface. Referring to FIG. 6b, slot trench 114 is patterned and etched through polysilicon layer 121, gate insulator 122 and into semiconductor body 110. In the preferred embodiment slot trench 114 extends into semiconductor body 110 approximately 0.5 microns. It will be apparent to those skilled in the art that slot trench 114 may have a depth within semiconductor body 110 of greater than 1.0 micron. Next, the sides and bottom of slot trench 114 may be implanted with a dopant such as boron by conventional methods. After the implant, the structure may be annealed by oxidation or a rapid thermal anneal.

Figure 6C:
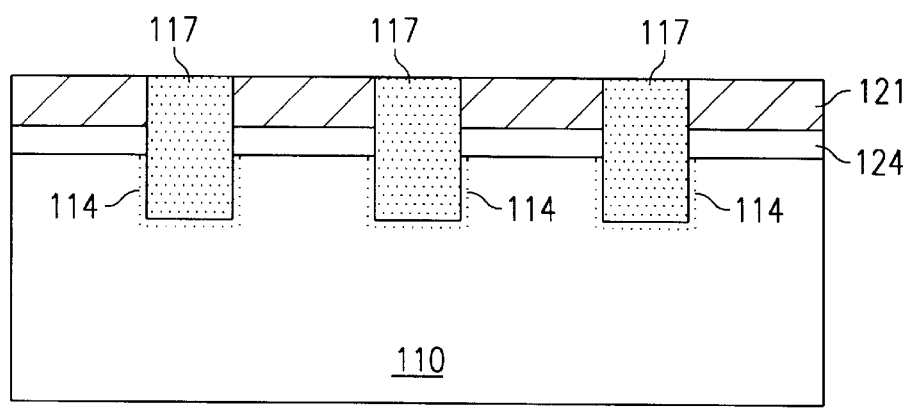
Figure 6D:
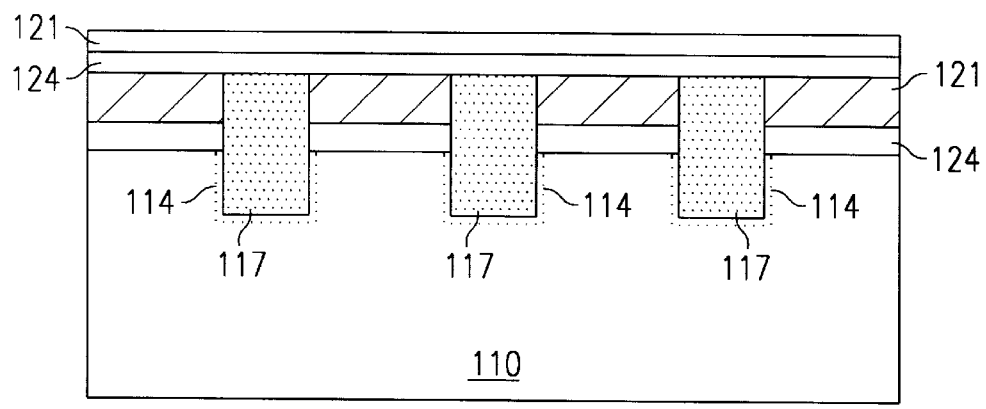

Referring to FIG. 6c, dielectric layer 117 may be deposited, for example, by plasma enhanced chemical-vapor-deposition (PECVD) to fill slot trench 114. In the preferred embodiment, dielectric layer 117 comprises TEOS oxide. Dielectric layer 117 is then etched-back to planarize the structure. It should be noted that this step may be omitted as will be discussed below. Referring to FIG. 6d, interlevel dielectric layer 126 is formed over the surface of the structure. In the preferred embodiment, interlevel dielectric layer 126 comprises a layer of oxide 128 formed by LPCVD and a layer of nitride 130 also formed by LPCVD. It will be apparent to those skilled in the art that nitride layer 130 is optional and need not be formed and that oxide layer 128 may be formed by alternative methods well known in the art.

Figure 7:
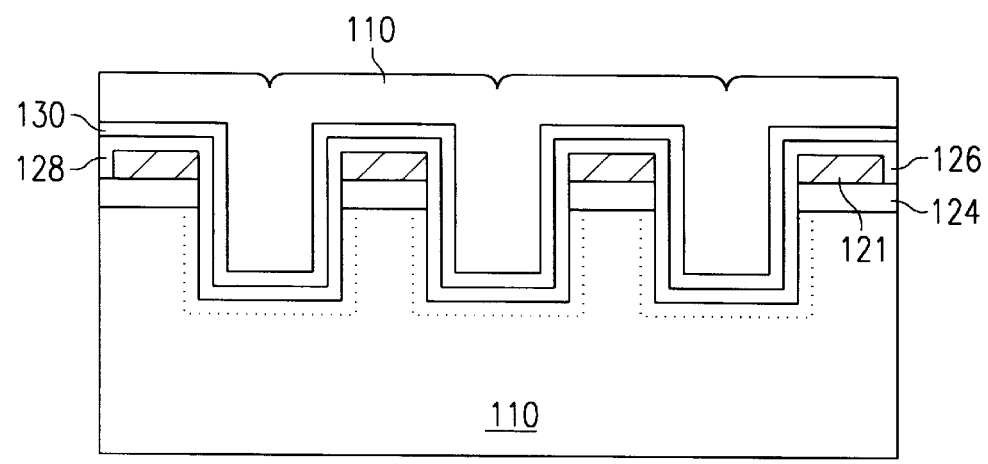
FIGS. 6a–6e and 7 are cross-sectional views of the EPROM of FIG. 5 at various stages of fabrication.
Figure 6E:
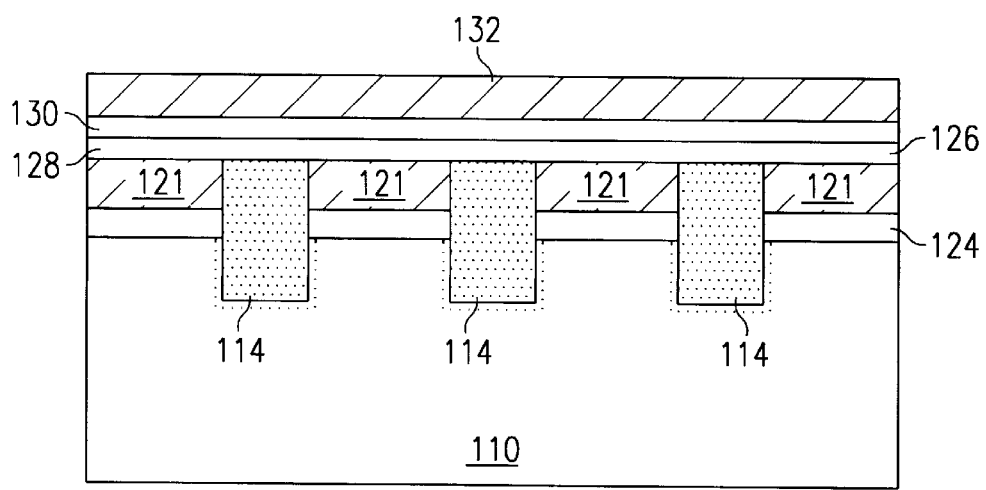

Referring to FIG. 6e, a second layer of conductive material, such a polysilicon layer 132, is deposited over the surface of the structure. It should be noted that if the formation of dielectric layer 117 is omitted, polysilicon layer 132 will be deposited so as to also fill the trench as shown in FIG. 7. Finally, polysilicon layer 132, interlevel dielectric layer 126, and polysilicon layer 121 may be etched to form floating gates 122 and control gate 120, as shown in FIG. 5.

Subsequent to the process steps described above, processing will continue to form source/drain regions, interconnections and other elements (not shown) as discussed above relative to the first preferred embodiment.

Figure 8:
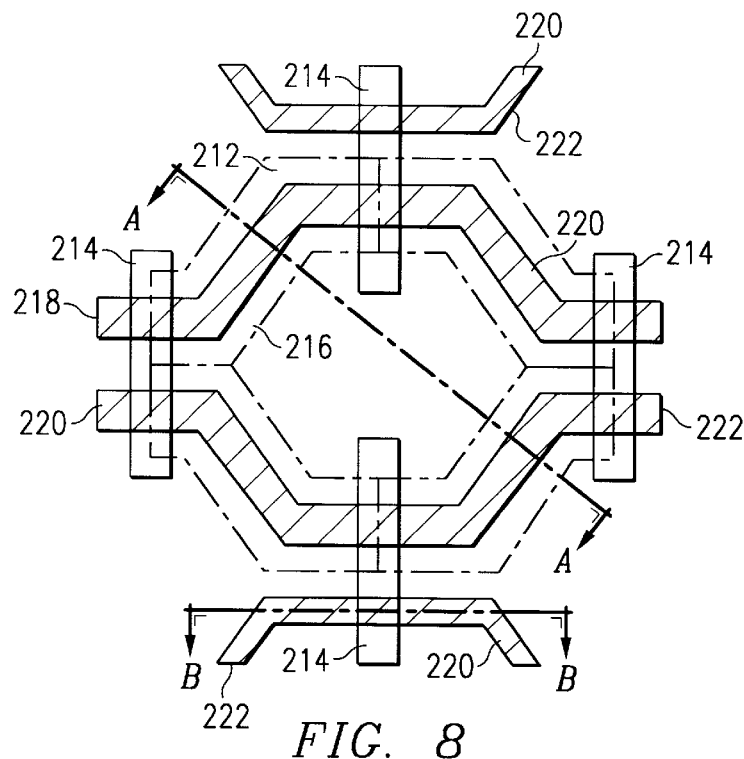
FIG. 8 is a top view of a portion of an EPROM according to a third preferred embodiment of the invention.

The invention may also be applied to "X"-cell EPROM configurations. A top view of a third preferred embodiment of the invention is shown in FIG. 8. The EPROM of FIG. 8 contains a large number of memory cells 212 commonly referred to as "X"-cells because of their configuration. Slot trenches 214 separate columns of memory cells 212 instead of the traditional LOCOS isolation. Each memory cell 212 consists of a source region 216, a drain region 218, a control gate 220, and a floating gate 222. It should of course be noted that source and drain regions 216 and 218 may be reversed in that region 216 may comprise the drain and region 218 comprise the source.

Figure 9A:
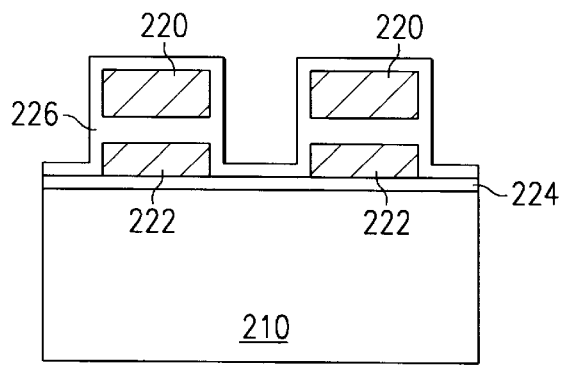
FIGS. 9a–b are cross-sectioned views of the EPROM of FIG. 8.
Figure 9B:
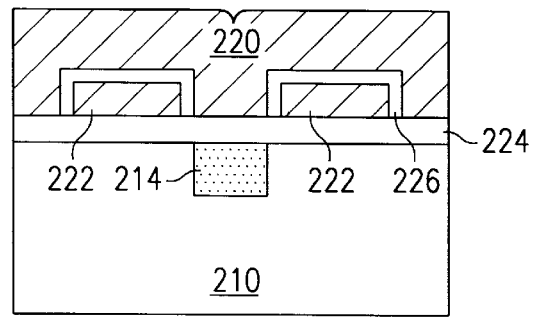

FIGS. 9a and 9b show cross-sectional views of the EPROM of FIG. 8 at lines A–A' and B–B', respectively. Slot trench 214 is located within semiconductor body 210. A gate insulator 224 covers the surface of semiconductor body 210. Gate insulator 224 may, for example comprise a thermal or deposited gate oxide. Floating gates 222 typically comprise a first layer of polysilicon. An interlevel insulating layer 226 separates floating gates 222 from control gate 220. Interlevel insulating layer 226 may, for example, comprise a layer of interlevel nitride and a layer of interlevel oxide. It will be apparent to those skilled in the art that other dielectrics may alternatively be used.

The structure of FIGS. 8, 9a and 9b may be fabricated using the same process described above with reference to FIGS. 4a–4e or FIGS. 6a–6e. The difference in forming the structures is merely in the patterns used in forming the different structures.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A programmable memory device having a memory array formed in a semiconductor body including a plurality of memory cells arranged into rows and columns comprising:

a plurality of parallel and spaced apart slot trenches, said slot trenches formed in sequences between said columns, said slot trenches located at the crossings of diagonals with respect to said rows and columns, each of said slot trenches extending below said surface of said semiconductor body between said columns;

a plurality of floating gates formed on a surface of said semiconductor body but separated from said surface of said semiconductor body by a gate dielectric, said floating gates positioned between said slot trenches;

a plurality of control gates, each of said control gates extending over at least one of said floating gates and a portion of said slot trenches, said control gates running perpendicular to said slot trenches and parallel to each other, exactly two of said control gates running over each of said slot trenches away from the periphery of the array of said rows and columns of memory cells; and a plurality of source/drain regions formed in said semiconductor body between said control gates and between said slot trenches.

2. The device of claim 1, wherein said plurality of slot trenches are each filled with a dielectric material.

3. The device of claim 2, wherein said dielectric material comprises TEOS oxide.

4. The device of claim 2, wherein said dielectric material extends above said surface of said semiconductor body between said floating gates.

5. The device of claim 1 wherein said plurality of slot trenches each extend below said surface of said semiconductor body a depth of 0.5 microns.

6. The device of claim 1 wherein said plurality of slot trenches each extend below said surface of said semiconductor body a depth of less that 1.0 microns.

7. The device of claim 1 further comprising an insulating layer located between said floating gates and said control gate.

8. The device of claim 7 wherein said insulating layer comprises a layer of silicon dioxide and a layer of silicon nitride.

9. The device of claim 7, wherein said control gate and said insulating layer extend into each of said slot trenches below said surface of said semiconductor body.

10. A programmable memory device having a memory array formed in a semiconductor body including a plurality of memory cells arranged into rows and columns comprising:

a plurality of slot trenches for isolating meory cells of one of said columns from adjacent columns, said slot trenches formed awith sides parallel to the direction of said columns and between said columns, each of said slot trenches extending below said surface of said semiconductor body between said columns, said trenches being filled with a dielectric material;

a plurality of polysilicon floating gates formed on a surface of said semiconductor body but separated from said surface of said semiconductor body by a gate dielectric, said floating gates positioned between said slot trenches;

a plurality of control gates, each of said control gates extending over at least one of said floating gates and separated therefrom by a dielectric, said control gates running perpendicular to said slot trenches and parallel to each other; and a plurality of source/drain regions formed in said semiconductor body between said control gates and between said slot trenches.

* * * * *